United States Patent [19]

Coucoulas

[11] 3,964,093

[45] June 15, 1976

[54] BONDING OF DISSIMILAR WORKPIECES TO A SUBSTRATE

[75] Inventor: Alexander Coucoulas, Bridgewater Township, Mercer County, N.J.

[73] Assignee: Western Electric Company, Inc., New York, N.Y.

[22] Filed: July 15, 1974

[21] Appl. No.: 488,860

Related U.S. Application Data

[62] Division of Ser. No. 413,006, Nov. 5, 1973, Pat. No. 3,914,850.

[52] U.S. Cl. ................................ 357/70; 357/69
[51] Int. Cl.² ................ H01L 23/48; H01L 29/44; H01L 29/52; H01L 29/60
[58] Field of Search ............................ 357/69, 70

[56] References Cited

UNITED STATES PATENTS 3,778,887  12/1973  Suzuki et al. .................... 357/70

*Primary Examiner*—Edward J. Wolciechowicz
*Attorney, Agent, or Firm*—M. Y. Epstein; G. D. Green; J. Schuman

[57] ABSTRACT

Device leads are compliantly bonded and external leads are directly bonded to a substrate with a single stroke of a bonding tool. The external leads are comprised in a lead frame that includes a compliant medium portion for bonding the device leads.

2 Claims, 8 Drawing Figures

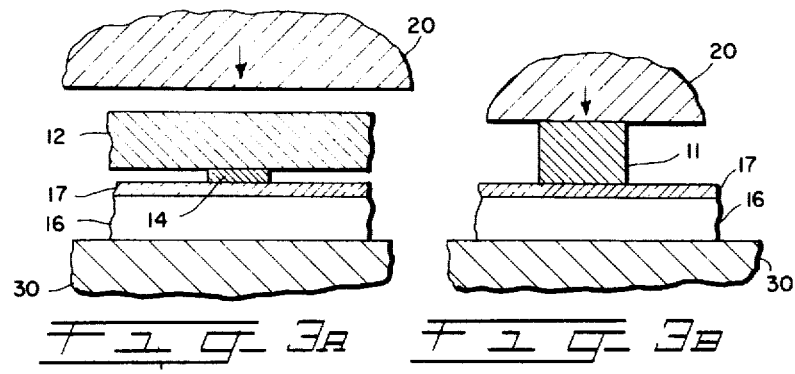
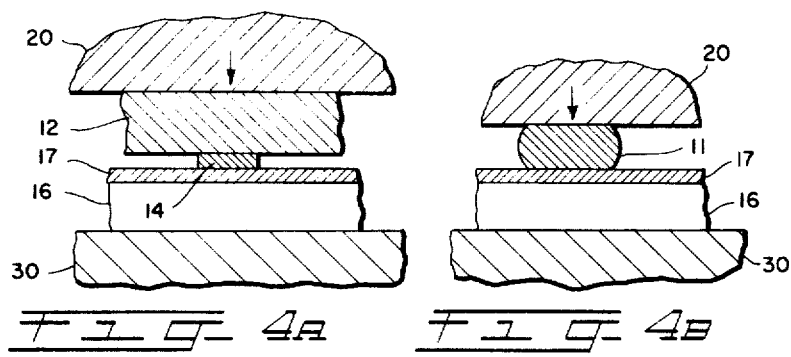
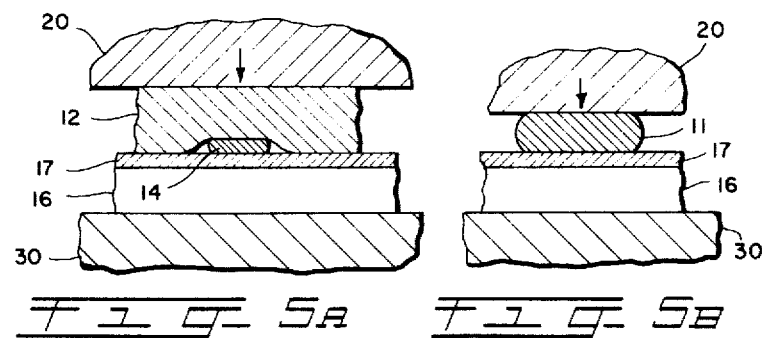

BONDING OF DISSIMILAR WORKPIECES TO A SUBSTRATE

This is a division, of application Ser. No. 413,006 filed Nov. 5, 1973, now U.S. Pat. No. 3,914,850 issued Oct. 28, 1975.

BACKGROUND OF THE INVENTION

1. Field of the Invention

This invention relates to a method of bonding workpieces and, more particularly, to a method of simultaneously bonding at least two dissimilar workpieces to a third workpiece, and to an article adapted for use with the method.

2. Description of the Prior Art

It is well known that two metallic workpieces can be bonded together by positioning the workpieces against each other and applying bonding energy to the abutting workpieces in the form of mechanical pressure and either thermal or ultrasonic energy. It is also well known that workpieces of some materials can be bonded together solely by applying mechanical pressure, where the pressure is sufficient to significantly deform at least one of the workpieces. More typically, however, a combination of mechanical pressure and either thermal or ultrasonic energy is used.

In compliant bonding (as disclosed in U.S. Pat. Nos. 3,533,155, 3,650,454, 3,669,333, 3,625,783, and 3,655,177), a compliant medium, such as aluminum, is placed between a bonding tool and a workpiece to be bonded. Typically, several smaller workpieces, such as electronic device leads, are to be simultaneously bonded to a larger workpiece, such as a circuit substrate. When mechanical pressure and, if necessary, thermal or ultrasonic energy are applied to the compliant medium, the compliant medium deforms around the smaller workpieces, thus limiting the clamping pressure applied to each smaller workpiece to that pressure necessary to deform the compliant medium around the smaller workpieces. Compliant bonding is particularly useful for simultaneously bonding multiple smaller workpieces to a larger workpiece because the compliant medium regulates the pressure applied to each smaller workpiece, thereby compensating for dimensional or positional irregularities in the smaller workpieces and the larger workpiece.

Electronic devices are often assembled by multiple bonding steps. For example, relatively thin leads on a beam-lead semiconductor device may be bonded to a substrate in a first step and relatively thick leads for connection to external circuits may be bonded to the substrate in a second step. Because of the different thicknesses and material properties of the device leads and the external leads, different bonding methods are usually used for the two steps. Compliant bonding can advantageously be used for the first step of bonding the device leads to the substrate, whereas direct bonding, wherein the bonding tool contacts the leads directly, can advantageously be used for bonding the external leads to the substrate. The external leads are typically fabricated as part of a lead frame that comprises connecting portions for holding the external leads in position during bonding. After bonding, the connecting portions of the lead frame are severed and discarded.

It would be advantageous to combine two bonding steps, such as those described above, into one step, while maintaining the individual characteristics of the separate bonding steps.

SUMMARY OF THE INVENTION

I have discovered that a lead frame can be fabricated with a portion usable as a compliant medium. External leads comprised in the lead frame are directly bonded to a substrate and leads on a leaded device are compliantly bonded to the substrate, both with a single stroke of a bonding tool, the compliant medium portion of the lead frame being interposed between the bonding tool and the device leads, and the compliant medium portion and the connecting portions of the lead frame being severed after the bonding step. The material of the lead frame is chosen to enhance bonding of the external lead portions to the substrate and to inhibit bonding of the compliant medium portion to the device leads.

These and other aspects of the invention will become apparent from consideration of the attached drawings and the following descriptions.

BRIEF DESCRIPTION OF THE DRAWINGS

FIGS. 3A, 4A and 5A are cross-sectional views of a device lead and FIGS. 3B, 4B and 5B are cross-sectional views of an external lead at corresponding sequential points during the bonding stroke of the bonding tool.

DETAILED DESCRIPTION

Figure 1:
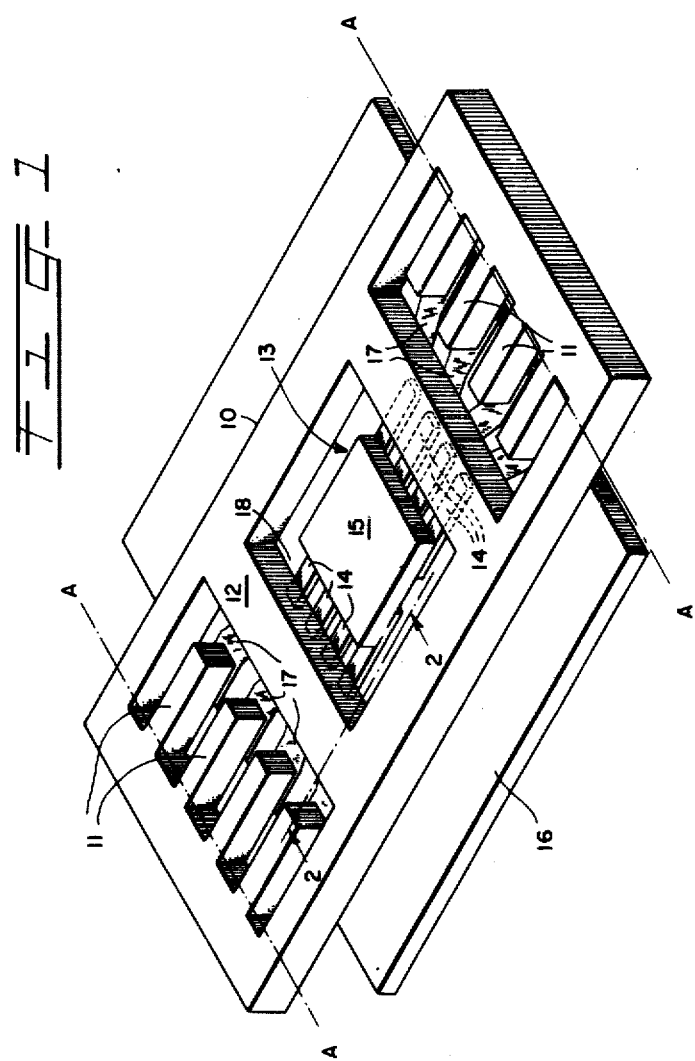
FIG. 1 is a perspective view of a lead frame and a leaded device positioned with respect to a substrate for bonding according to the methods of the invention.

Referring now to FIG. 1, lead frame 10 comprises external leads 11 and web 12 having aperture 13 therein. Device leads 14 are shown to be rectangular beam leads attached to device 15. However, it will be apparent that other types of device leads, such as round leads, can advantageously be used with the invention. Substrate 16 supports circuit paths 17 fabricated thereon. Web 12 overlaps device leads 14 to serve as a compliant medium for bonding device leads 14, as shown, for example, at region 18. After the bonding operation to be described, lead frame 10 is severed along lines A—A by means well known in the art and not a part of this invention, leaving external leads 11 attached to substrate 16. The thicknesses of lead frame 10 and device leads 14 are exaggerated in FIG. 1 for clarity. Typically, external leads 11, part of lead frame 10, are rectangular in cross section and five to ten times thicker than device leads 14.

It will be understood that the particular configurations shown in FIG. 1 are exemplary only, and that numerous configurations of substrates, leaded devices, and lead frames can be used without departing from the scope of the invention.

Figure 2:
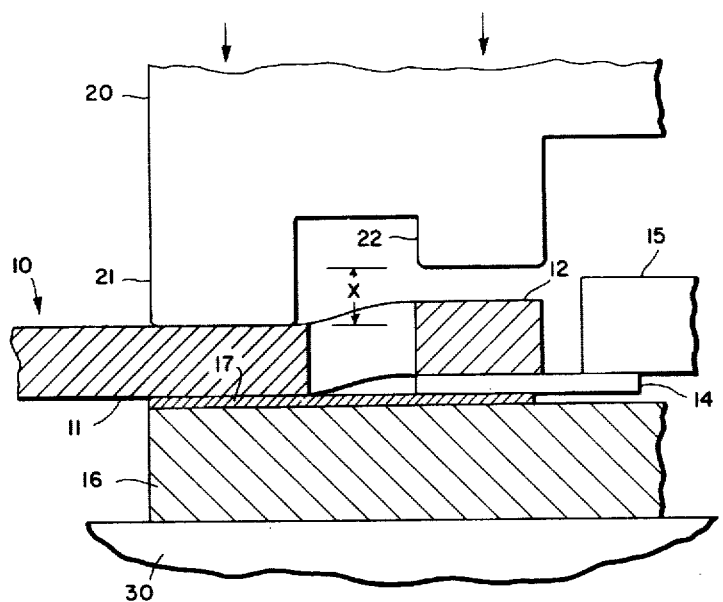
FIG. 2 is a partial cross section of the elements shown in FIG. 1 with the addition of a bonding tool.

FIG. 2 shows a cross-sectional view of the elements shown in FIG. 1 with the addition of a bonding tool 20 and a base 30. Bonding tool 20 is shown in a position near the beginning of its bonding stroke. The bonding tool is shaped so that portion 21 accommodates the thickness of external leads 11 and so that portion 22 accommodates the combined thicknesses of device leads 14, web 12, and a distance about half the thickness of external leads 11. External leads 11 are the same thickness as web 12 since all are part of lead frame 10. Therefore, dimension X can be expressed in equation form as:

$$X = 0.5T_F + T_D \qquad (1)$$

where $T_F$ is the thickness of lead frame 10 and $T_D$ is the thickness of device leads 14. During the initial part of its bonding stroke, bonding tool 20 deforms lead frame 10 from the planar configuration shown in FIG. 1 to the non-planar configuration shown in FIG. 2, without substantially changing the cross sections of external leads 11 or device leads 14.

FIGS. 3A, 4A and 5A are cross-sectional views showing one of device leads 14 and FIGS. 3B, 4B and 5B are cross-sectional views showing one of external leads 11 during successive positions of bonding tool 20 during its bonding stroke. In FIGS. 3A and 3B, bonding tool 20 is shown at substantially the same point in its bonding stroke as in FIG. 2. In FIGS. 4A and 4B, bonding tool 20 has been moved further through its bonding stroke to deform external lead 11 to about half its initial thickness and to initially contact web 12 of lead frame 10. In FIGS. 5A and 5B, bonding tool 20 has been moved to substantially the end of its bonding stroke to further deform external lead 11, and to deform web 12 around device lead 14, thereby also deforming device lead 14. At this point, the bonding tool is essentially stopped by web 12 from moving farther.

Lead frame 10 is preferably much thicker than device lead 14 so that what is known as "anvil effect" does not cause too high a pressure to be applied to device lead 14. Anvil effect occurs in a compliant bonding process when the workpiece being bonded penetrates so far into the compliant member that the pressure regulating effect of the compliant member is lost. The comparative thicknesses of the compliant member and the workpiece being bonded that are necessary to prevent anvil effect are also related to the stress-strain characteristics of the materials comprising these elements. Typically, the compliant member is softer and thicker than the workpiece being bonded. According to the preferred embodiment of the invention, the material of lead frame 10 is chosen to serve both as a compliant member (web 12) and as external leads 11. If the material of lead frame 10 is too hard, it may not be compliant enough for effective compliant bonding, whereas if it is too soft, external leads 11 may not be sufficiently rigid. Therefore, the choice of material for and the thickness of lead frame 10 takes into account the desired characteristics of external leads 11 and the characteristics necessary for use of web 12 as a compliant medium. One satisfactory material for lead frame 10 is oxygen-free high-conductivity (OFHC) copper.

Another important requirement regarding the relative characteristics of lead frame 10 and device leads 14 is that, generally speaking, the compliant medium portion of the lead frame does not readily bond to the device leads. However, external leads 11 must bond to circuit paths 17, and device leads 14 must bond to circuit paths 17. Lead frame 10 can be treated selectively, either in the region of external leads 11 to enhance bonding to circuit paths 17, or in the region of web 12 to inhibit bonding to device leads 14. Selective plating with nickel, a bond inhibiting metal, and gold, a bond enhancing metal, is one of several ways of achieving these results, as will be described in the example below.

Alternatively, lead frame 10 can be a composite fabricated substantially from a first relatively hard material suitable for the external leads 11, and having a substantial thickness of a second relatively soft material, such as nickel, attached thereto in the region of web 12 that contacts device leads 14, the second material being suitable as a compliant medium. The second material could be bonded or laminated to web 12, or could be plated onto web 12. Of course, dimension X shown in FIG. 2 must be adjusted to accommodate any substantial difference in thickness between external leads 11 and web 12.

While bonding between lead frame 10 and device leads 14 is generally not desired, it may be convenient for device 15 to be temporarily attached to lead frame 10 by temporary bonds between lead frame 10 and device leads 14. Such temporary attachment may facilitate positioning and holding device 15 during the bonding operation of substrate 16, and may be particularly useful if multiple lead frames 10 are fabricated in a continuous strip. Such a strip can be intermittently advanced under a bonding tool between bonding strokes to supply devices and lead frames for successive bonding operations. This method of feeding devices for bonding is described more completely in U.S. Pat. No. 3,655,177, noted above.

Temporary bonds between device leads 14 and lead frame 10 can be achieved by the use of a weak adhesive, or by forming a weak metallic bond. The bond thus formed, however, should release easily after external leads 11 are severed from the unwanted remainder of lead frame 10, so that the remainder can be easily removed from device leads 14.

Thermal or ultrasonic energy may be applied by various well-known means to the workpieces being bonded. Thermal energy can be applied by heating either or both bonding tool 20 and base 30, or by focusing radiant energy directly onto appropriate portions of lead frame 10, device leads 14, and substrate 16. Alternatively, ultrasonic energy can be applied to bonding tool 20 by an appropriate transducer attached thereto. Various means for applying thermal energy and/or ultrasonic energy are well known to those skilled in the art.

To further demonstrate the principles of the invention, exemplary component dimensions, component materials, and bonding parameters will now be set forth for the process described above. Referring again to FIG. 1, beam leads 14 can be gold about 0.5 mil thick by about 5 mils wide. Lead frame 10 can be OFHC copper about 5 mils thick, and external leads 11 can be about 10 mils wide. The web 12 of lead frame 10 can overlap beam leads 14 by about 4 mils. The lead frames can be plated overall with a layer of nickel about 0.5 micron thick, and can then be plated with a layer of gold from 2–5 microns thick, at least where external leads 11 are to be bonded to circuit paths 17, but not on surfaces where web 12 overlaps beam lead 13. Substrate 16 can be alumina. Circuit paths 17 can be a gold layer about 30,000A thick over a titanium layer about 5,000A thick.

Referring again to FIG. 2, region 21 of bonding tool 20 can be shaped to contact about 10 mils of the length of each external lead 11, and region 22 can be shaped to contact the portion of web 12 that overlaps beam leads 13. Dimension X can be determined from equation (1):

$$X = 0.5(5) + 0.5 = 3.0 \text{ mils}$$

The base 30 can be heated to about 200°C and the bonding tool 20 can be heated to about 400°C, to result in a temperature at the interfaces between external leads 11 or beam leads 13 and circuit paths 17 of about 300°C during bonding.

A force of about 15 lbs. is sufficient to deform each external lead 11 to the final configuration shown in FIG. 5. Since there are 8 external leads in this example, the total force applied to bonding tool 20 in the direction of substrate 16 can be about 120 lbs. The dwell time during which the bonding tool is allowed to remain in the final position shown in FIG. 5 can be about 5 seconds.

What is claimed is:

1. A lead frame for the fabrication of an article of manufacture, said article comprising a substrate and first and second leads bonded to first and second sites, respectively, on said substrate, said second lead initially being an integral part of said lead frame and said first lead not forming a portion thereof, said lead frame further comprising:

a support member having integral therewith:

a. a compliant bonding portion having a surface thereof for engagement with said first lead for the compliant bonding of said first lead to said first site when pressure is applied to said first lead through said bonding portion, said bonding portion being of a material softer than said first lead, and said bonding portion surface being of a bond inhibiting material so as not to adhere to said first lead or said substrate during the bonding operation; and b. a second portion comprising said second lead projecting from said support member;

said lead frame being configured to enable engagement of said compliant bonding portion with said first lead and the simultaneous engagement of a portion of said second portion with said second site on said substrate for the simultaneous bonding of said first and second leads to said first and second sites, respectively; and said second portion being detachable from the remainder of said frame including said compliant bonding portion to provide said second lead after the bonding of said leads to said substrate and to provide said article upon detachment and removal of said remainder of said frame therefrom.

2. The lead frame of claim 1 further comprising a bond enhancing coating on that surface of said second portion to be bonded to said second site on said substrate.

* * * * *